(12) United States Patent
Hong et al.

(10) Patent No.: US 10,297,523 B2
(45) Date of Patent: May 21, 2019

(54) POWER MODULE AND METHOD FOR MANUFACTURING THE SAME

(71) Applicant: DELTA ELECTRONICS, INC., Taoyuan (CN)

(72) Inventors: Shouyu Hong, Taoyuan (CN); Yanlin Chen, Taoyuan (CN); Zhenqing Zhao, Taoyuan (CN)

(73) Assignee: Delta Electronics, Inc., Taoyuan, Taiwan (CN)

( * ) Notice: Subject to any disclaimer, the term of this patent is extended or adjusted under 35 U.S.C. 154(b) by 0 days.

(21) Appl. No.: 14/959,635

(22) Filed: Dec. 4, 2015

(65) Prior Publication Data

US 2016/0165749 A1 Jun. 9, 2016

(30) Foreign Application Priority Data

Dec. 9, 2014 (CN) .......................... 2014 1 0748695

(51) Int. Cl.
*H05K 7/20* (2006.01)
*H01L 23/00* (2006.01)
(Continued)

(52) U.S. Cl.
CPC ...... *H01L 23/3677* (2013.01); *H01L 23/3735* (2013.01); *H01L 23/3737* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467; H01L 23/36–23/4735; H01L 23/3737;
(Continued)

(56) References Cited

U.S. PATENT DOCUMENTS 5,366,719 A * 11/1994 van Wingerden ..... B01J 8/0285
423/210
9,147,631 B2 * 9/2015 Otremba ........... H01L 23/49568
(Continued)

FOREIGN PATENT DOCUMENTS

CN     1551339 A    12/2004
CN   101043809 A     9/2007
(Continued)

OTHER PUBLICATIONS

Office Action dated May 11, 2016 by the TW Office.
The 1st office action issued in the counterpart CN application No. 201410748695.1 dated Feb. 5, 2018 by the SIPO.

*Primary Examiner* — Robert J Hoffberg
*Assistant Examiner* — Razmeen Gafur
(74) *Attorney, Agent, or Firm* — Yunling Ren

(57) ABSTRACT

A power module and a method for manufacturing the same are provided. The power module comprises: a substrate, at least one power device, and an organic heat dissipating structure. The substrate has an upper surface and a lower surface. The organic heat dissipating structure comprises a plurality of organic heat dissipating protrusions and it is located on the upper surface side or the lower surface side of the substrate and configured to transfer heat generated by the power device outwardly.

8 Claims, 14 Drawing Sheets

(51) Int. Cl.
  *H01L 25/07* (2006.01)
  *H01L 23/367* (2006.01)
  *H01L 23/373* (2006.01)
  *H01L 23/433* (2006.01)
  *H01L 23/495* (2006.01)

(52) U.S. Cl.
  CPC .... *H01L 23/4334* (2013.01); *H01L 23/49568* (2013.01); *H01L 25/072* (2013.01); *H05K 7/209* (2013.01); *H01L 24/16* (2013.01); *H01L 24/29* (2013.01); *H01L 24/32* (2013.01); *H01L 24/48* (2013.01); *H01L 24/73* (2013.01); *H01L 24/83* (2013.01); *H01L 2224/0401* (2013.01); *H01L 2224/04042* (2013.01); *H01L 2224/16227* (2013.01); *H01L 2224/16245* (2013.01); *H01L 2224/291* (2013.01); *H01L 2224/32225* (2013.01); *H01L 2224/32245* (2013.01); *H01L 2224/48227* (2013.01); *H01L 2224/48247* (2013.01); *H01L 2224/73265* (2013.01); *H01L 2224/8384* (2013.01); *H01L 2224/83851* (2013.01); *H01L 2924/0002* (2013.01); *H01L 2924/1033* (2013.01); *H01L 2924/10253* (2013.01); *H01L 2924/13055* (2013.01); *H01L 2924/13091* (2013.01); *H01L 2924/181* (2013.01)

(58) Field of Classification Search
  CPC . H01L 2224/04042; H01L 2224/16227; H01L 2224/16245; H01L 2224/291; H01L 2224/32225; H01L 2224/32245; H01L 2224/48247; H01L 2224/73265; H01L 2224/8384; H01L 2224/83851; H01L 2924/0002; H01L 2924/10253; H01L 2924/1033; H01L 2924/13055; H01L 2924/13091; H01L 2924/181; H01L 23/3735; H01L 23/4334; H01L 23/49568; H01L 25/072; H01L 25/16; H01L 25/29; H01L 25/32; H01L 25/48; H01L 25/73; H01L 25/83
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
  See application file for complete search history.

(56) References Cited

U.S. PATENT DOCUMENTS

| | | | |
|---|---|---|---|
| 9,754,856 B2* | 9/2017 | Caroff | H01L 23/38 |
| 2002/0015288 A1* | 2/2002 | Dibene, II | G06F 1/18 361/711 |
| 2002/0062946 A1 | 5/2002 | Murayama et al. | |
| 2003/0175647 A1* | 9/2003 | Wachter | F23M 5/08 432/192 |
| 2003/0183379 A1 | 10/2003 | Krassowski | |
| 2004/0022029 A1* | 2/2004 | Nagatomo | H01L 23/3735 361/709 |
| 2004/0150956 A1* | 8/2004 | Conte | H01L 23/3677 361/709 |
| 2004/0177947 A1 | 9/2004 | Krassowski et al. | |
| 2005/0280998 A1* | 12/2005 | Lin | H05K 7/209 361/704 |
| 2006/0044762 A1* | 3/2006 | Kikuchi | H01L 25/162 361/704 |
| 2006/0250776 A1 | 11/2006 | Abul-Haj et al. | |
| 2007/0025081 A1* | 2/2007 | Berlin | H01L 23/44 361/698 |
| 2007/0091572 A1* | 4/2007 | Schulz-Harder | H01L 23/373 361/704 |
| 2007/0236883 A1* | 10/2007 | Ruiz | H01L 23/473 361/699 |
| 2008/0007918 A1* | 1/2008 | Lederer | H01L 24/72 361/707 |
| 2008/0192430 A1* | 8/2008 | Brandenburg | H01L 23/467 361/695 |
| 2008/0266046 A1* | 10/2008 | Lukaszewski | H01C 1/028 338/53 |
| 2008/0266801 A1* | 10/2008 | Weiss | H01L 23/427 361/700 |
| 2009/0086436 A1* | 4/2009 | Kluge | F21V 29/004 361/707 |
| 2009/0108392 A1* | 4/2009 | Davies | H01L 21/76229 257/503 |
| 2009/0226752 A1* | 9/2009 | Barratt | H01J 1/025 428/595 |
| 2010/0002397 A1* | 1/2010 | Toh | H01L 23/4006 361/713 |
| 2010/0073883 A1* | 3/2010 | Miyamato | C23C 24/04 361/709 |
| 2010/0128441 A1* | 5/2010 | Soda | H01L 25/115 361/709 |
| 2010/0142154 A1* | 6/2010 | Collet | G03B 21/16 361/714 |
| 2010/0142155 A1* | 6/2010 | Mertol | H01L 23/055 361/719 |
| 2010/0271785 A1* | 10/2010 | Hsieh | H01L 23/36 361/717 |
| 2011/0014417 A1* | 1/2011 | Lemak | H01L 23/373 428/99 |
| 2011/0038122 A1* | 2/2011 | Ahangar | H01L 23/4275 361/700 |
| 2011/0073797 A1* | 3/2011 | Kanatzidis | C01B 19/007 252/71 |
| 2011/0128707 A1* | 6/2011 | Rozman | H01L 23/24 361/709 |
| 2012/0106086 A1* | 5/2012 | Schloerke | H01L 25/072 361/715 |
| 2012/0218714 A1* | 8/2012 | Robert | H01L 23/053 361/713 |
| 2012/0275116 A1 | 11/2012 | Heo | |
| 2013/0010425 A1* | 1/2013 | Son | H01L 23/4334 361/689 |
| 2013/0010429 A1* | 1/2013 | Tonomura | H01L 23/3735 361/720 |
| 2013/0114210 A1* | 5/2013 | Ebersberger | H01L 23/473 361/702 |
| 2013/0135824 A1* | 5/2013 | Harubeppu | H01L 23/34 361/709 |
| 2013/0148301 A1* | 6/2013 | Dede | F25B 21/00 361/702 |
| 2013/0308269 A1* | 11/2013 | Rozman | H01L 23/24 361/690 |
| 2013/0322019 A1* | 12/2013 | Gasse | H01L 21/4882 361/709 |
| 2014/0246648 A1* | 9/2014 | Im | H01L 33/382 257/13 |
| 2015/0001557 A1* | 1/2015 | Yoon | H01L 25/0753 257/88 |
| 2015/0054417 A1* | 2/2015 | Lee | H05B 37/0272 315/201 |
| 2015/0219810 A1* | 8/2015 | Taka | G02B 5/0841 359/584 |
| 2015/0223317 A1* | 8/2015 | Oi | H05K 1/181 361/709 |
| 2015/0245523 A1* | 8/2015 | Takagi | H02M 7/003 361/715 |
| 2015/0305189 A1* | 10/2015 | Strader | H01L 23/367 361/707 |

(56) References Cited

U.S. PATENT DOCUMENTS

2016/0002439 A1* 1/2016 Tsuda .................... C09J 163/00
                                                    361/723
2016/0298011 A1* 10/2016 Pihale .................... C09J 183/14

FOREIGN PATENT DOCUMENTS

| | | |
|---|---|---|
| CN | 101720569 A | 6/2010 |
| CN | 201503870 U | 6/2010 |
| CN | 202405323 U | 8/2012 |
| TW | 200527631 A | 8/2005 |
| WO | 0169996 A1 | 9/2001 |

* cited by examiner

POWER MODULE AND METHOD FOR MANUFACTURING THE SAME

CROSS REFERENCE TO RELATED APPLICATION

This application is based on and claims priority to Chinese Patent Application No. 201410748695.1, filed on Dec. 9, 2014, the entire contents of which are incorporated herein by reference.

TECHNICAL FIELD

The present disclosure relates to a power module, and more particularly, to a power module having a structure for heat dissipation.

BACKGROUND

In power supply industry, indicators for a power module, in particular for a power converter include high efficiency, high power density and high reliability. Then high efficiency means reduction of energy consumption, which is beneficial to energy conservation and emission reduction, as well as environment protection and reduction in use cost. The high power density means small volume and light weight, which could bring reduction in transportation cost and space requirement, thus leading to reduction in construction cost. Higher reliability is accompanied by longer service life and lower maintenance cost.

The above three indicators sought by the industry are closely linked with good thermal management. Firstly, at a lower operating temperature, conduction losses of a power module (e.g., Metal-Oxide-Semiconductor Field-Effect Transistor, MOSFET) may be reduced, which is beneficial to improving system efficiency.

Secondly, on many occasions, heat generated by a power device may directly influence its power density. Taking a power converter for an example, semiconductor devices therein typically have relatively large energy consumption. Therefore, the semiconductor devices may be considered as one of the most important factors determining efficiency of the power converter. Moreover, tolerable temperature of a semiconductor device has a certain limit, and the semiconductor device may be deteriorated sharply in performance or even disabled when the limit is exceeded. Therefore, it is vital important to provide a high-efficiency heat dissipating system capable of keeping temperature of a semiconductor chip within an acceptable range.

Thirdly, lifespan of the semiconductor device is also closely associated with the working temperature. A relatively lower operating temperature may enable a longer service life of the semiconductor device. Generally, there is such an engineering empirical rule in the electronic field that the lifespan of the device may be shortened by half for each 10° C. rise of the temperature. As can be known from above, the good thermal management is of critical importance in improving conversion efficiency, power density and reliability of the device.

Now, taking an example of a semiconductor device using DBC (Direct Bonded Copper) ceramic substrate as substrate, as shown in FIG. 1, a power device (chip) 1 is mounted on a substrate 2 by die bonding material, and electric, mechanical and thermal connections between the power device 1 and traces (not shown in FIG. 1) of the substrate is realized by the die bonding material. An area of upper surface of the power device 1 is covered with a molding component, so as to achieve protection in aspects of mechanical, anti-dust, moisture proof and insulation. Typically, a heatsink 3 is mounted on a lower surface of the power device 1, since heat generated by the power device 1 may be transferred mainly via the lower surface of chip to the bottom side of the substrate 2, thereby forming a relatively good channel for heat transfer. The heatsink 3 may be made from material with a relatively high thermal conductivity, for example, copper, which has a thermal conductivity above 300 W/m·K. In order to ensure a good heat conduction path between the lower surface of the power device 1 and the surface of the heatsink 3, thermal interface material such as heat-conducting silicone grease 4 may be applied therebetween. The heat-conducting silicone grease 4 is filled in gaps between the power device 1 and the heatsink 3, thus realizing a better heat conduction than air. In addition, in order to facilitate users to install a heatsink, a spring clip 5 is provided for realizing mechanical fixation between the power device 1 and the heatsink 3.

The foregoing information is merely disclosed to facilitate understanding of background of the present disclosure. Therefore, the foregoing information may include information not constituting the prior art known to those of ordinary skill in the art.

SUMMARY

According to one aspect of the present disclosure, it is provided a power module, including: a substrate, at least one power device, and an organic heat dissipating structure. The substrate has an upper surface and a lower surface; the at least one power device is bonded onto the upper surface of the substrate; and the organic heat dissipating structure including a plurality of organic heat dissipating protrusions is located on the upper surface side or the lower surface side of the substrate and configured to transfer heat generated by the power device outwardly.

According to another aspect of the present disclosure, it is provided a method for manufacturing a power module, including: providing a substrate having an upper surface and a lower surface; providing at least one power device; bonding the at least one power device onto the upper surface of the substrate; and providing an organic heat dissipating structure including a plurality of organic heat dissipating protrusions on the upper surface side or the lower surface side of the substrate, the heat dissipating structure being configured to transfer heat generated by the power device outwardly.

BRIEF DESCRIPTION OF THE DRAWINGS

By referring to detailed description of the drawings and exemplary embodiments, the foregoing and other characteristics and advantages of the present disclosure will become more apparent.

DETAILED DESCRIPTION

Figure 1:
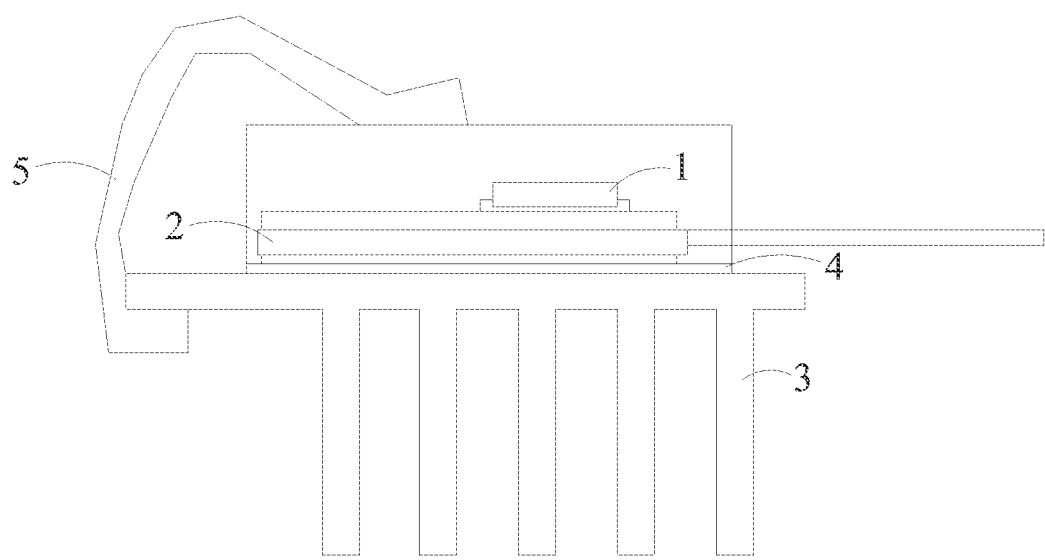
FIG. 1 is a schematic diagram of a conventional power module.

Exemplary embodiments will be described more comprehensively by referring to accompanying drawings. However, exemplary embodiments can be implemented in many forms. It shall not be understood that the present disclosure is limited to embodiments as set forth herein; instead, these embodiments are provided to ensure the present disclosure to be more comprehensive and complete. And the conception of these exemplary embodiments shall be conveyed to those skilled in the art across-the-board. In the drawings, thickness of areas and layers is exaggerated for distinctness. The same numbers in drawings represent the same or similar structures, and thus detailed description thereof may be omitted.

Characteristics, structures or features as described may be incorporated into one or more embodiments in any suitable way. Many concrete details are provided in the following descriptions for a full understanding of embodiments of the present disclosure. However, those skilled in the art should realize that the technical solution of the present disclosure may be implemented without one or even more of specific details, and/or by using other alternative methods, components, materials and the like. In other circumstances, known structures, materials or operations are not shown or described in detail for the avoidance of fuzziness of various aspects of the present disclosure.

Figure 2:
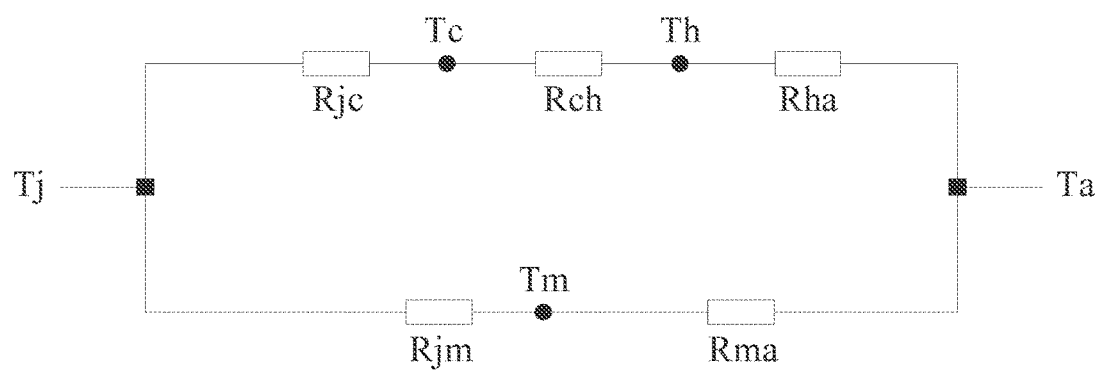
FIG. 2 shows thermal resistances and a temperature monitor points along a heat dissipation path.

First of all, heat dissipation of the power module is explained as follows. Taking heat dissipation of a power semiconductor device in an air cooling system as an example, heat generated by the power semiconductor device is dissipated into ambient via two paths. In Path I, heat is transferred to a heatsink through a DBC substrate, and further to respective surfaces of the heatsink in heat exchange with the ambient, and finally dissipated into the ambient through those surfaces. In Path II, heat is transferred onto a surface of a molding component and dissipated into the ambient through the surface of the molding component. In order to explain influence of paths on heat dissipation, temperature monitor positions may be defined as below: a position of the power semiconductor device is defined as a junction, abbreviated to j; a point of the outside surface of the substrate corresponding to a midpoint of the power semiconductor device is defined as a case, abbreviated to c; the heatsink is defined as a heatsink, abbreviated to h; the ambient is defined as ambient, abbreviated to a; and a surface point of the molding component above the midpoint of the power semiconductor device is defined as molding, abbreviated to m. Accordingly, thermal resistances corresponding to each part may be abbreviated to following signs. Rjc: a thermal resistance from the junction to the case, Rch: a thermal resistance from the case to the heatsink, Rha: a thermal resistance from the heatsink to the ambient, Rjm: a thermal resistance from the junction to the molding, and Rma: a thermal resistance from the molding to the ambient. Similarly, temperature of each point may be also defined as Tx. For example, Tj stands for a temperature of the junction. Thus, thermal resistances and temperature monitor positions along the heat dissipation path may be illustrated in FIG. 2. In order to illustrate the heat dissipating effect of the heatsink, an analysis is made hereinafter to the heat transfer path of Tj from the substrate to the heatsink.

Taking an example of the semiconductor device using a DBC (Direct Bonding Copper) substrate as shown in FIG. 1, Rjc is normalized as 1K/W; Rch includes two parts, namely thermal resistance ($R_{TIM}$) of TIM (thermal interface materials, e.g., the heat-conducting silicone grease 4 as used in FIG. 1) layer and thermal resistance ($R_h$) of the heatsink; $R_{TIM}$ is about 1K/W when an ordinary heat-conducting silicone grease is used, the heatsink usually is made from material with good thermal conductivity (e.g., copper, etc.). Therefore, the Rh value is relatively small, about 0.1K/W. Rha is convective thermal resistance between the heatsink and the ambient. Convective thermal resistance refers to thermal resistance between an object surface and a fluid by convection. Factors influencing convective thermal resistance are different from factors of thermal-conduction resistance inside an object. Convective thermal resistance is closely related to a shape of heat convection surface and a velocity of the fluid, etc. The higher the velocity of the fluid near the object surface is, the greater the convective heat transfer coefficient is, and the smaller the convective thermal resistance is; the greater the heat convection area is, the smaller the convective thermal resistance is. Therefore, it shall be mainly considered to increase the heat convection area and increase the velocity of the fluid in order to reduce convective thermal resistance. The heatsink is made from metal (e.g., copper, etc.) by extrusion forming process. Therefore, it is difficult to enlarge the surface area of the heatsink. Accordingly, in conventional technology, the means of increasing the velocity of a fluid is adopted in order to reduce the thermal resistance as far as possible. For example, wind velocity inside a power module (e.g., a power supply system) is designed to be relatively high. However, the effect of the means is not desirable because the thermal resistance is still relatively high (about 5K/W for example). Thus it can be seen that it is a long-standing problem and bottleneck on how to reduce heat transfer resistance between the heatsink and the ambient.

A heat dissipating structure is provided so as to reduce heat transfer resistance between the heatsink and the ambient from another point of view in allusion to the foregoing bottleneck.

The First Embodiment

Figure 3:
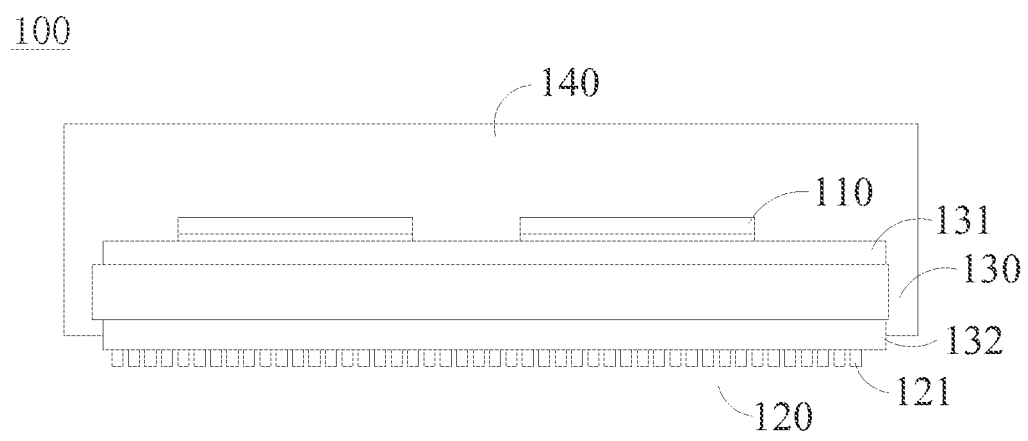
FIG. 3 is a schematic diagram of a power module according to a first embodiment.

As shown in FIG. 3, a preferred embodiment of the present disclosure provides a power module 100 (for example, a power converter), including a substrate 130, a power device 110 and an organic heat dissipating structure 120 (which means the base material is organic material, it could also contain higher thermal conductivity fillers like ceramic, glass, metal and so on). The substrate 130 has an upper surface 131 and a lower surface 132; and the power device 110 may be a MOSFET (such as ordinary Si MOSFET and gallium nitride MOSFET, etc.), a diode and an IGBT, etc. In the embodiment, the power device 110 is a power chip, and is bonded onto the upper surface 131 of the substrate 130. In the embodiment, the organic heat dissipating structure 120 includes a plurality of organic heat dissipating protrusions 121 and is located on one side of the upper surface 131 or the lower surface 132 of the substrate 130 so as to transfer heat generated by the power device 110 outwardly through the substrate 130 and the organic heat dissipating structure 120.

In an embodiment, the power device 110 and the substrate 130 are coated with a molding component, the power device 110 is bonded onto the substrate 130 by die bonding material (for example, a solder, a conductive adhesive, conductive sintering slurry, a thermal conductive adhesive and the like); the substrate 130 may be a PCB, a DBC, a lead frame, a metallized ceramic substrate or an insulated metal substrate (IMS substrate), etc. In some embodiments, the bottom side (i.e., the side near to the substrate 130) of the power device 110 has an electrode, for example, a vertical-type device, an flip chipped planar device, etc. The die bonding material usually needs to be electrically conductive, and usually a bonding pad (not shown) on the substrate 130 is corresponding to the die bonding material for realizing mechanical and electrical/thermal connection between the chip and the substrate. In some embodiments, regarding to a planar power device which is only provided with electrodes on the top side (i.e., the side far away from the substrate 130), the die bonding material between the planar power device and the substrate has thermal conductivity property. Electrical connection between the electrode on the front side of the power device and the substrate or a leading-out terminal may be realized by wire bonding, which is omitted in the accompanying drawing of the embodiment.

On some occasions, a power chip may be protected by the molding component for improving its reliability as the power chip is relatively fragile and is vulnerable to moisture, contamination and mechanical stress, etc. As shown in FIG. 3, the molding component 140 may merely protect the upper surface 131 of the substrate 130, the organic heat dissipating structure 120 is located on the lower surface 132 of the substrate 130, and heat generated by the power device 110 is transferred outwardly through the organic heat dissipating structure 120 via the substrate 130. In other embodiments, the molding component may protect both the upper surface and the lower surface of the substrate, and the organic heat dissipating structure is located on the surface of the molding compound.

In the embodiment, advantages of the present disclosure are further described by taking an example of applying an organic heatsink to a semiconductor power device using a DBC substrate (details of external pins and inner leads are omitted). However, application conditions of the present disclosure are not limited to this.

The heat dissipation effect of the organic heat dissipating structure 120 of the power module 100 in the present disclosure is explained by a group of comparative examples hereinafter.

Figure 4A:
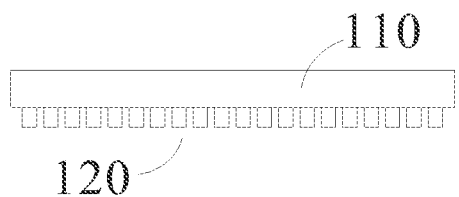
FIG. 4A and FIG. 4B respectively show comparison diagrams of a power module according to the first embodiment and the conventional power module.
Figure 4B:
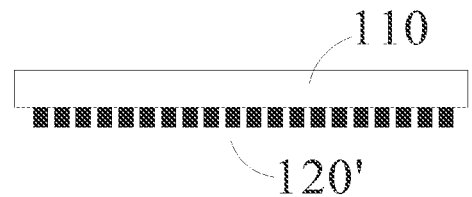

As shown in FIGS. 4A and 4B, for a simplified analysis, two different heat dissipating structures are respectively arranged underneath a 2 mm-thick copper block 110 whose upper surface may generate heat evenly, i.e., an organic heat dissipating structure 120 as shown in FIG. 4A, and a conventional high-heat-conductivity heat dissipating structure 120' as shown in FIG. 4B. The organic heat dissipating structure 120 is made from mainly organic material with a thermal conductivity of 2 W/m·K, and the high-heat-conductivity heat dissipating structure 120' is made from copper with a thermal conductivity of 380 W/m·K. Wind may blow through at the velocity of 10 m/s parallel to the surface of the substrate 130 for heat dissipation. The thermal resistance of 2 mm-thick copper block without any heat dissipating structure like 120 or 120' may be normalized as 1K/W. Tests show that Part A has a thermal resistance of 0.82K/W, and Part B has a thermal resistance of 0.75K/W. Thus it can be seen that although the thermal conductivity of the organic heat dissipating structure 120 is lower than that of the high-heat-conductivity heat dissipating structure 120', an organic material (such as resin material with high conductivity fillers) is much higher than metal in terms of formability, i.e., capable of being formed with bigger area of heat dissipation in limited space, thus significantly reducing convection heat transfer resistance between the heatsink and air; regarding to a heat dissipation path, internal thermal-conduction resistance does not play a dominant role, and the main part of thermal resistance is focused on convection heat transfer resistance. For this reason, on the whole, the organic heat dissipating structure 120 is basically equivalent to the high-heat-conductivity heat dissipating structure 120' in terms of heat dissipation performance. Besides, in the limited volume of the power module, bigger surface area may be formed in the organic heat dissipating structure 120. Therefore, the heat dissipation performance of the organic heat dissipating structure 120 is hopeful to be further improved.

Figure 5:
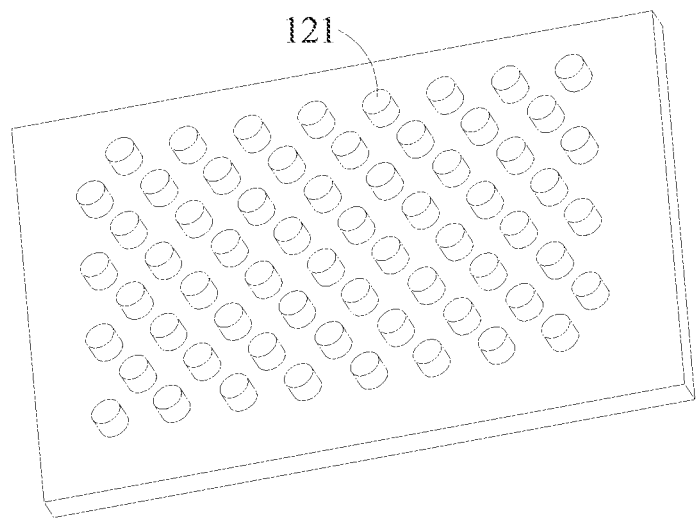
FIG. 5 is a schematic diagram of an organic heat dissipating structure of the power module according to the first embodiment.

FIG. 5 shows cylindrical organic heat dissipating protrusions 121 formed in multiple rows and uniform distribution, and two adjacent rows of the organic heat dissipating protrusions 121 are arranged in a staggered way with each other for the convenience of processing and further increasing airflow contact area to facilitate heat dissipation. The form of organic heat dissipating protrusions is not limited to this. In other embodiments, the protrusions may be formed in pillar bumps or fins distributed uniformly or non-uniformly, and in a staggered way or in an aligned way.

Although the organic heat dissipating protrusions are arranged with a large distribution density, there still are gaps allowing air flow among the organic heat dissipating protrusions. On the premise of ensuring good ventilation, areas of the organic heat dissipating protrusions shall be increased as far as possible for improving the heat dissipation efficiency.

Wherein, the organic heat dissipating protrusions 121 include an organic heat conduction material with a thermal conductivity between 0.2 w/m·K and 20 w/m·K. For example, the organic material may be provided by using organic materials (such as epoxy resin, acrylic acid, organic silicon and the like) as an insulated matrix in which insulating fillers with high thermal conductivity (such as aluminum oxide ceramic, silicon dioxide, aluminum nitride ceramic, graphite particles and metallic oxide particles, etc.) are doped. In this case, the organic heat dissipating protrusions serve as electrical insulators, free from short circuit resulted from being in contact with other electronic components, thus avoiding short-circuit fault in conventional design resulted from long fins of the heatsink made from materials with high thermal conductivity (such as copper). On some occasions where insulation is not necessary, the organic material serving as a matrix may be doped with metal particles with high thermal conductivity.

The organic heat dissipating protrusions 121 may be formed onto the upper surface and/or the lower surface of the power module by means of screen printing process, or by means of direct spraying or planting process (e.g., ultrasonic bonding, etc.).

Optionally, the organic heat dissipating protrusions 121 may be formed onto the surface of the power device or that of the substrate through film-pressing process, specifically including: providing a thermal conductive resin on the surface of the power device or that of the substrate, where the thermal conductive resin may be provided by using thermosetting organic material as a matrix and internally doped with a filler having high thermal conductivity for improving the thermal conductivity thereof, and the thermal conductive resin may present a form of liquid state or B-stage state (an intermediate stage in thermosetting resin reaction); and then, forming the organic heat dissipating protrusions in a desirable shape by molds under high temperature and high pressure, thereby the thermal conductive resin is converted into a form of solid state.

Therefore, in the present disclosure, a mechanical fixed structure (for example, a spring clip, etc.) for fixing the power device and the organic heat dissipating structure may be omitted, thus avoiding extra space occupation and reducing the demands for surface evenness of the power device; besides, thermal interface materials may be omitted also, thus avoiding bad influence resulted from degradation of thermal conductivity property of thermal interface materials during long-term high temperature service process.

The Second Embodiment

Figure 6:
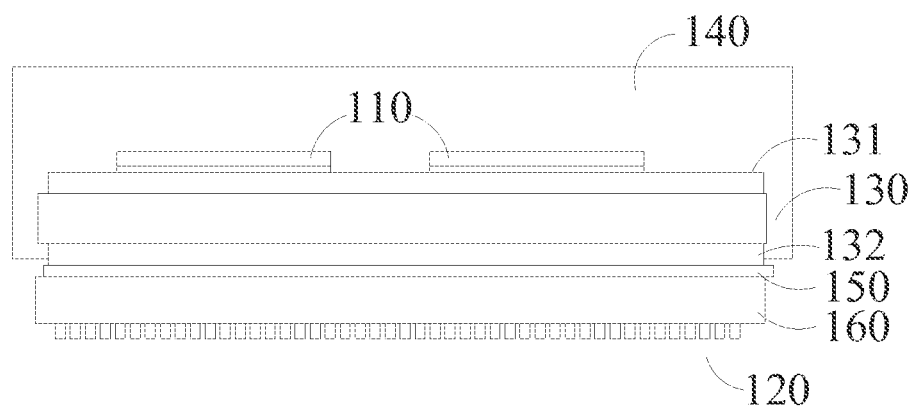
FIG. 6 is a schematic diagram of a power module according to a second embodiment.

Referring to FIG. 6, unlike the previous first embodiment, the lower surface 132 of the substrate 130 in the present embodiment is attached with a thermal spread 160 by a thermal conductive adhesive 150, the thermal spread 160 is typically made from metal (such as copper/aluminum, etc.), graphite, ceramic and other materials, and the organic heat dissipating structure 120 is arranged at a windward side (the side far away from the substrate 130) of the thermal spread 160. Other parts of the second embodiment are approximately the same as the first embodiment, not repeated any more herein.

The Third Embodiment

Figure 7:
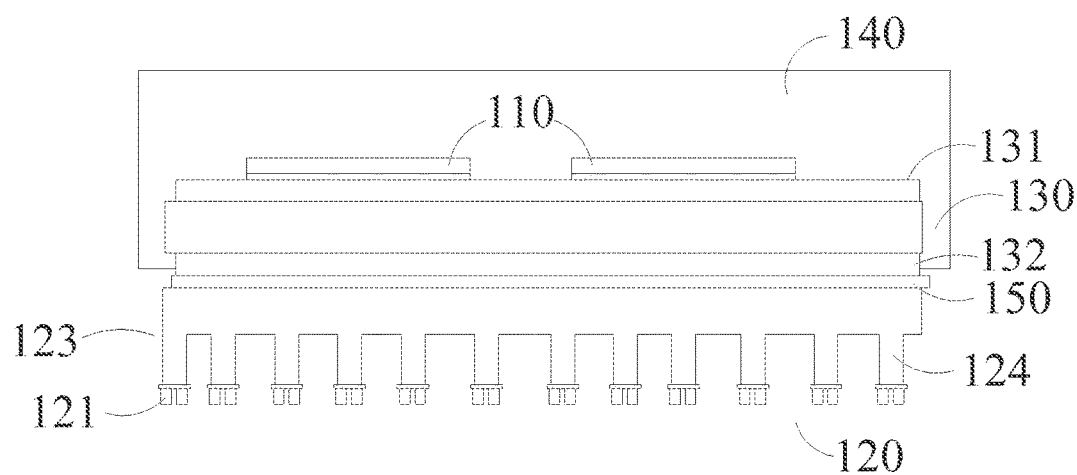
FIG. 7 is a schematic diagram of a power module according to a third embodiment.

Referring to FIG. 7, unlike the previous first embodiment, the organic heat dissipating structure 120 in the present embodiment further includes a metal heat dissipating part 123, which is attached onto the lower surface 132 of the substrate by a thermal conductive adhesive 150, and the organic heat dissipating protrusions 121 are formed onto the lower surface of the metal heat dissipating part 123. In the embodiment, the metal heat dissipating part 123 may be provided as a conventional heatsink, which includes a plurality of heat dissipating fins 124. The organic heat dissipating protrusions 121 are formed onto the lower surface of the heat dissipating fins 124, for example, by means of dispensing process. The metal heat dissipating part 123 may further expand the heat dissipation area. The organic heat dissipating protrusions 121 are arranged below the conventional heatsink partly, thus fully using the space. Furthermore, the conventional heatsink is generally electrically conductive, and shall be subject to electrical insulation by separating from surrounding components at a certain distance, which may leads to waste of space. By contrast, in the organic heat dissipating structure of the present embodiment, the electrically insulated organic heat dissipating protrusions 121 are arranged on the surface of the heat dissipating fins 124, free from short circuit resulted from being in contact with other electronic components, thus avoiding short-circuit fault in conventional design due to long fins of the electrically conductive heatsink. Additionally, the heat dissipating structure of the present disclosure is particularly suitable for a power module with small size and low height, for example, a more and more compact power supply system.

Other parts of the third embodiment are approximately the same as the first embodiment, not repeated any more herein.

The Fourth Embodiment

Figure 8:
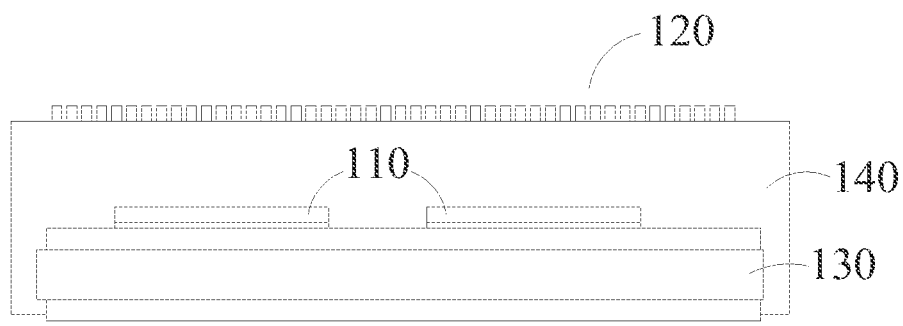
FIG. 8 is a schematic diagram of a power module according to a fourth embodiment.

Referring to FIG. 8, unlike the previous first embodiment, the power device 110 and the substrate 130 in the present embodiment are coated with a molding component 140, the organic heat dissipating structure 120 is located on the surface of the molding component 140, and heat generated by the power device 110 is transferred outwardly through the organic heat dissipating structure 120 via the molding component 140. In FIG. 8, the organic heat dissipating structure 120 is located at an upper side of the molding component 140. However, in other embodiments, the substrate 130 may also be arranged above the power device 110 (for example, the arrangement position thereof as shown in FIG. 8 may be rotated by 180 degrees), and the organic heat dissipating structure 120 is arranged below the molding component 140. In practical application, arrangement positions of the organic heat dissipating structure 120 and the molding component 140 may be changed as required according to the need of the power module.

Other parts of the fourth embodiment are approximately the same as the first embodiment, not repeated any more herein.

The Fifth Embodiment

Figure 9:
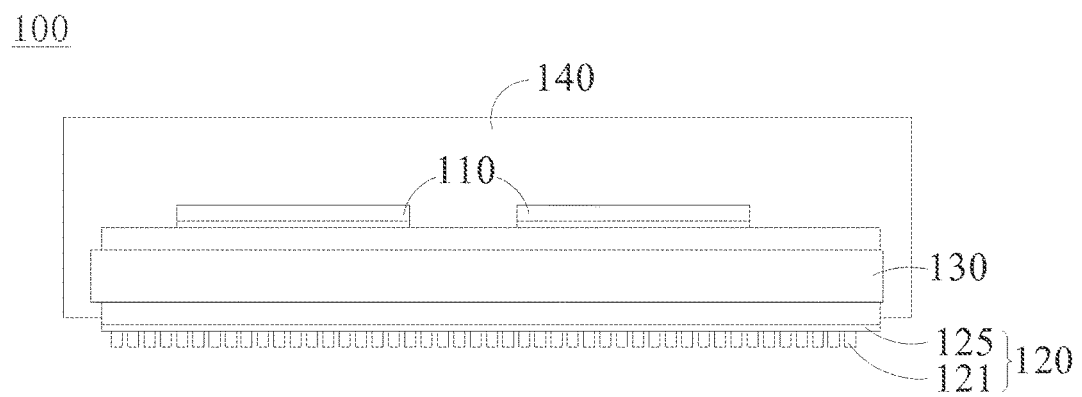
FIG. 9 is a schematic diagram of a power module according to a fifth embodiment.

Referring to FIG. 9, unlike the previous first embodiment the organic heat dissipating structure 120 in the present embodiment further includes a plane layer 125 which is arranged between the substrate 130 and the organic heat dissipating protrusions 121. The plane layer 125 and the organic heat dissipating protrusions 121 may be made from different materials, i.e., in the embodiment, the organic heat dissipating structure 120 including the organic heat dissipating protrusions 121 and the plane layer 125 is made from two or even more types of materials. For example, the plane layer 125 may be made from material with lower contact thermal resistance with substrate for further improving heat dissipation effect. Alternatively, the plane layer 125 may be made from material easy to be combined with both the organic heat dissipating protrusions 121 and substrate 130, while the organic heat dissipating protrusions 121 are made from different materials. For another example, the plane layer 125 and the organic heat dissipating protrusions 121 may be made from a same type of material. Under such circumstances, the organic heat dissipating structure 120 is only made from one type of material. In terms of technological process, the plane layer 125 may be formed on the substrate 130, for example, by curing process, and then the organic heat dissipating protrusions 121 may be formed on the lower surface of the plane layer 125 by printing or die-casting process, etc. In an embodiment, the plane layer 125, the substrate 130 and the organic heat dissipating protrusions 121 have good bond performance. Accordingly, it is also possible that the organic heat dissipating protrusions 121 may be independently molded and then adhered onto the substrate 130 by a cohesive plane layer 125. Subsequently, the organic heat dissipating structure 120 (containing the organic heat dissipating protrusions 121 and the plane layer 125) may be further adhered onto a heat dissipation surface of the power module by another binding material (not show in FIG. 9).

Other parts of the fifth embodiment are approximately the same as the first embodiment, not repeated any more herein.

As can be seen from above, the organic heat dissipating structure of the power module in the present disclosure may be provided with a bigger surface area. Therefore, the convective heat transfer resistance between the organic heat dissipating structure and the ambient may be substantially reduced, and further the heat dissipation performance of the organic heat dissipating structure may be improved. In addition, the organic heat dissipating structure of the power module in the present disclosure may, on the premise of ensuring normal heat dissipation of the power module, be reduced in its own height and space occupation. Particularly in constant pursuit of power density in the field of power supply, the requirement for reduction of a heatsink in size is becoming increasingly urgent. Compared with a conventional metal heatsink, the organic heat dissipating structure of the power module in the present disclosure is of great significance in realizing miniaturization of the power module.

Furthermore, the power module of the present disclosure needs neither a mechanical fixed structure (such as a spring clip and the like) to fix the organic heat dissipating structure and the power device nor thermal interface materials such as silicone grease, etc. So, problems in the prior art such as increases in entire thickness and design cost resulted thereby may be avoided.

Figure 10:
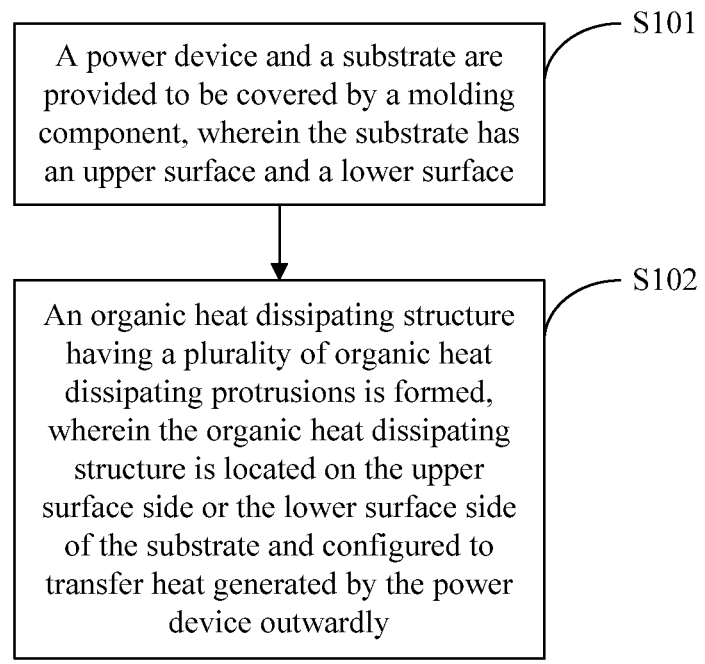
FIG. 10 illustrates a flow chart of a method for manufacturing a power module according to an embodiment.

FIG. 10 illustrates a flow chart of a method for manufacturing a power module according to an embodiment. As shown in FIG. 10, the method is used for manufacturing the power module according to any embodiment described above, and includes followings steps:

in step 101, a power device and a substrate are provided to be covered by a molding component, wherein the substrate has an upper surface and a lower surface;

in step 102, an organic heat dissipating structure having a plurality of organic heat dissipating protrusions is formed, wherein the organic heat dissipating structure is located on the upper surface side or the lower surface side of the substrate and configured to transfer heat generated by the power device outwardly.

Figure 11:
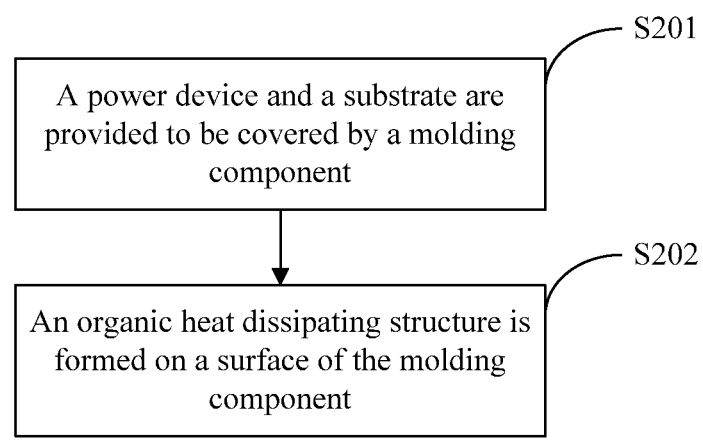
FIG. 11 illustrates a flow chart of a method for manufacturing a power module according to an embodiment.

FIG. 11 illustrates a flow chart of a method for manufacturing a power device according to an embodiment. As shown in FIG. 11, in the present embodiment, the method may further include steps as follows:

in step 201, a power device and a substrate are provided to be covered by a molding component; and in step 202, an organic heat dissipating structure is formed on a surface of the molding component.

In the present embodiment, the heat generated by the power device is transferred outwardly through the organic heat dissipating structure via the molding component.

Figure 12:
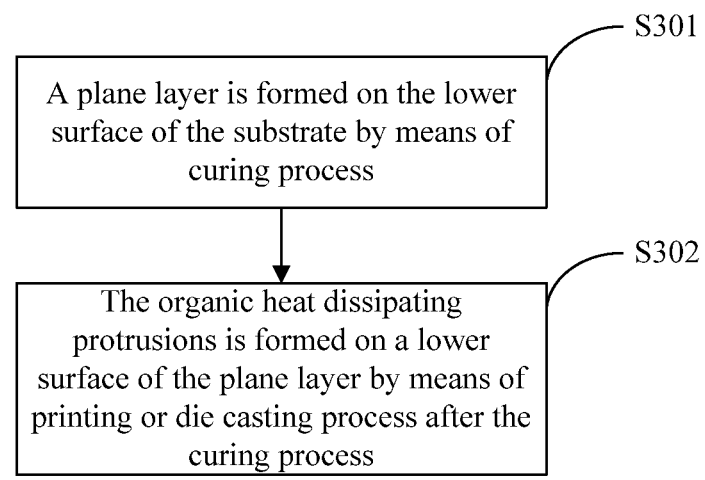
FIG. 12 illustrates a flow chart of a method for manufacturing a power module according to an embodiment.

FIG. 12 illustrates a flow chart of a method for manufacturing a power module according to an embodiment. As shown in FIG. 12, in the present exemplary embodiment, when the organic heat dissipating structure is formed, following steps may be performed:

in step S301, a plane layer is formed on the lower surface of the substrate by means of curing process, and in step S302, the organic heat dissipating protrusions is formed on a lower surface of the plane layer by means of printing or die casting process after the curing process.

Figure 13:
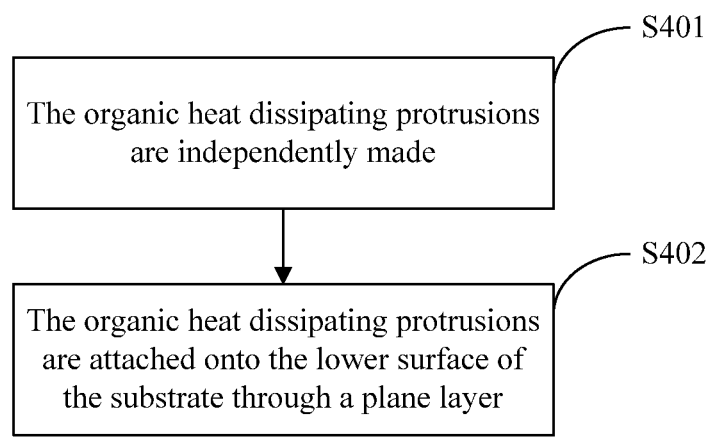
FIG. 13 illustrates a flow chart of a method for manufacturing a power module according to an embodiment.

FIG. 13 illustrates a flow chart of a method for manufacturing a power module according to an embodiment. As shown in FIG. 13, in the present exemplary embodiment, the organic heat dissipating structure may be formed by the following steps:

in step 401, the organic heat dissipating protrusions are independently made; and in step 402, the organic heat dissipating protrusions are attached onto the lower surface of the substrate through a plane layer.

Figure 14:
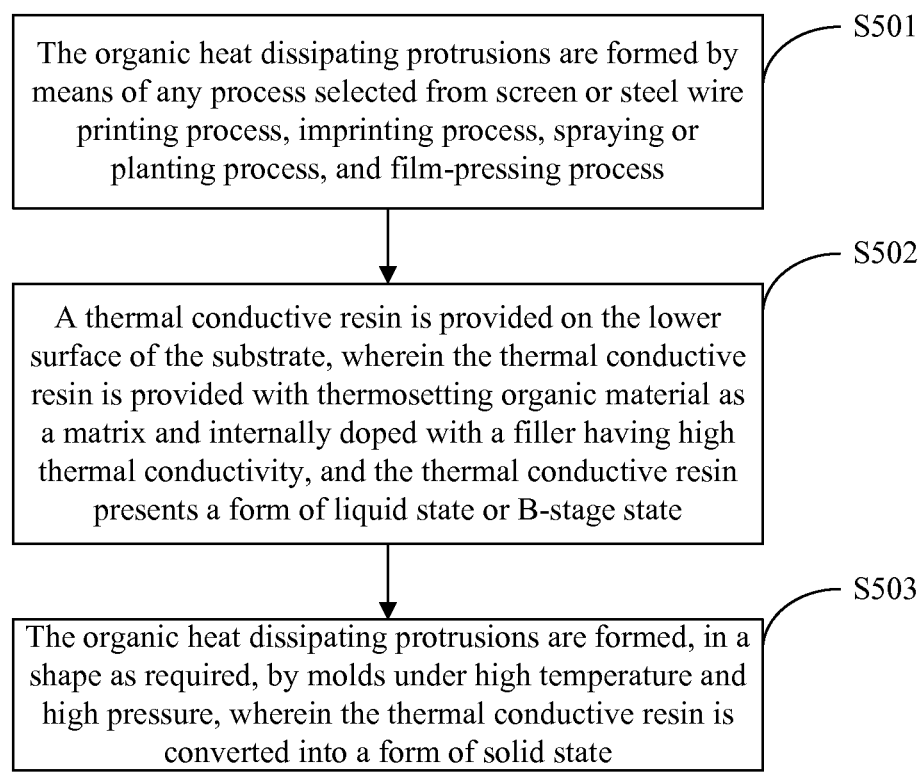
FIG. 14 illustrates a flow chart of a method for manufacturing a power module according to an embodiment.

FIG. 14 illustrates a flow chart of a method for manufacturing a power module according to an embodiment. As shown in FIG. 14, in the present exemplary embodiment, the organic heat dissipating structure may be formed by the following steps:

in step 501, the organic heat dissipating protrusions are formed by means of any process selected from screen printing process, imprinting process, spraying or planting process, and film-pressing process.

Furthermore, in the present exemplary embodiment, the step of forming the organic heat dissipating protrusions by means of film-pressing process may include:

in step 502, a thermal conductive resin is provided on the lower surface of the substrate, wherein the thermal conductive resin is provided with thermosetting organic material as a matrix and internally doped with a filler having high thermal conductivity, and the thermal conductive resin presents a form of liquid state or B-stage state; and in step 503, the organic heat dissipating protrusions are formed, in a shape as required, by molds under high temperature and high pressure, wherein the thermal conductive resin is converted into a form of solid state.

It should be noted that, a lot of details described above in the embodiments of the power module are also applicable for implementing the embodiments of the method, and thus not repeated herein. Moreover, the sequence of steps described above is only for illustrative without any limitation, and can be modified as required according to actual needs.

What is mentioned above concretely illustrated and describes exemplary embodiments of the present disclosure. Nevertheless, it should be understood that the present disclosure is not limited to the embodiments disclosed herein. On the contrary, the present disclosure is intended to cover various modifications and equivalent arrangements within the spirit and scope of the appended claims.

What is claimed is:

1. A power module, comprising:
    a substrate having an upper surface and a lower surface;
    at least one power device bonded to the upper surface of the substrate; and
    an organic heat dissipating structure comprising a heatsink attached onto a lower surface of the substrate by a thermal conductive adhesive and a plurality of organic heat dissipating protrusions, wherein an upper surface of the heatsink is attached on the lower surface of the substrate and configured to transfer heat generated by the power device outwardly, and
    wherein the heatsink comprises a plurality of heat dissipating fins, and the plurality of organic heat dissipating protrusions are arranged on a lower surface of the heat dissipating fins.

2. The power module of claim 1, wherein the power device and the substrate are coated with a molding component, and the heat generated by the power device is transferred outwardly through the organic heat dissipating structure via the substrate.

3. The power module of claim 1, wherein the organic heat dissipating protrusions are formed in pillar bumps, cylinders or fins.

4. The power module of claim 3, wherein the organic heat dissipating protrusions are formed in multiple rows and two adjacent rows are arranged staggeringly or aligningly with each other.

5. The power module of claim 1, wherein the organic heat dissipating protrusions are made from organic heat conduction material with a thermal conductivity between 0.2w/m·K and 20w/m·K.

6. The power module of claim 1, wherein a thermal spread by a thermal conductive adhesive is sandwiched between the lower surface of the substrate and the upper surface of the heatsink, the thermal spread is made from material having high thermal conductivity.

7. The power module of claim 1, wherein the organic heat dissipating protrusions are made from organic heat conduction material serving as a filler material, the filler material being provided with an organic material as a matrix and doped with particles having high thermal conductivity.

8. The power module of claim 7, wherein the organic material is selected from a group consisting of epoxy resin, acrylic acid and organic silicon, and the particles having high thermal conductivity are made from electrically insulated material selected from a group consisting of aluminum oxide ceramic, silicon dioxide, aluminum nitride ceramic, graphite, metallic oxide, and electrically conductive metal particles.

* * * * *